(12) United States Patent
Kamino et al.

(10) Patent No.: US 7,408,239 B2
(45) Date of Patent: *Aug. 5, 2008

(54) CAPTURE OF RESIDUAL REFRACTORY METAL WITHIN SEMICONDUCTOR DEVICE

(75) Inventors: Takeshi Kamino, Tokyo (JP); Toshiaki Tsutsumi, Tokyo (JP); Shuji Kodama, Tokyo (JP); Takio Ohno, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/650,978

(22) Filed: Jan. 9, 2007

(65) Prior Publication Data

US 2007/0114666 A1 May 24, 2007

Related U.S. Application Data

(63) Continuation of application No. 09/983,166, filed on Oct. 23, 2001, now Pat. No. 7,180,153.

(30) Foreign Application Priority Data

Mar. 30, 2001 (JP) .............................. 2001-101470

(51) Int. Cl.
*H01L 29/00* (2006.01)

(52) U.S. Cl. ...................................... 257/516; 257/536

(58) Field of Classification Search ......... 257/379–381, 257/516, 536–538, 543, E21.004; 438/332, 438/382, 383
See application file for complete search history.

(56) References Cited

U.S. PATENT DOCUMENTS

| 4,484,212 A | 11/1984 | Komatsu et al. |
| 4,689,579 A | 8/1987 | Shibata et al. |
| 5,336,631 A | 8/1994 | Potyraj et al. |
| 5,939,753 A * | 8/1999 | Ma et al. .................... 257/339 |
| 6,001,663 A | 12/1999 | Ling et al. |
| 6,083,785 A | 7/2000 | Segawa et al. |
| 7,180,153 B2 * | 2/2007 | Kamino et al. .............. 257/516 |

FOREIGN PATENT DOCUMENTS

| EP | 0 814 499 A1 | 12/1997 |
| JP | 03-019273 A | 1/1991 |
| JP | 11-214328 | 8/1999 |

* cited by examiner

*Primary Examiner*—Hung Vu
(74) *Attorney, Agent, or Firm*—Buchanan Ingersoll & Rooney PC

(57) ABSTRACT

There is provided a semiconductor device with a configuration in which a dummy silicide area 11 is provided in the vicinity of a non-silicide area 2 to easily capture residual refractory metals, resulting in an improved yield by preventing the trapping of residual refractory metals into a non-silicide area and thereby reducing a junction leakage within the non-silicide area.

11 Claims, 5 Drawing Sheets

US 7,408,239 B2

CAPTURE OF RESIDUAL REFRACTORY METAL WITHIN SEMICONDUCTOR DEVICE

CROSS REFERENCE TO RELATED APPLICATION

This application is a continuation of application Ser. No. 09/983,166, filed Oct. 23, 2001 now U.S. Pat. No. 7,180,153.

BACKGROUND OF THE INVENTION

1. Field of the Invention

The present invention relates to a semiconductor device which is directed to a reduced junction leakage failure caused by a residual refractory metal.

2. Description of the Prior Art

FIG. 6 is a sectional view taken in a direction of longitudinally of a resistor in a conventional semiconductor device. FIG. 7 is a plan view showing the separated state of the diffused resistor shown in FIG. 6. FIG. 8 is a sectional view taken in an orthogonal direction to the direction of longitudinally of the diffused resistor shown in FIG. 6. FIG. 9 is a plan view of the diffusion resistor shown in FIG. 8.

Referring to the figures, a non-silicide area 2 is deposited on a substrate (n-well) 1 of a semiconductor device, and the non-silicide area 2 forms a diffused resistor portion (resistive element) on both ends of which silicide areas 3 are deposited as terminals on which contact holes for conduction with an upper wiring are formed.

Accordingly, the non-silicide area 2 constitutes one resistor 4 having silicide areas 3 as two terminals on both ends thereof. Herein, since for instance, an A/D converter, a D/A converter and so on require a plurality of resistors 4 according to the number of gradation sequence thereof and the circuit composition thereof as shown in FIG. 7, these resistors 4 are uniformly provided in a parallel arrangement, to thereby improve the circuit accuracy. By the way, in recent portable devices, there has been a trend in which the resistor 4 is configured to have a length of 100 microns or more in order to obtain a large resistance value.

An isolation dielectric 5 (isolation oxide) is deposited on both the ends of the non-silicide area 2 on the substrate 1, and separates the resistor 2. A protective oxide 6 ($SiO_2$) is deposited over the surface of the non-silicide area 2. The protective oxide 6 is formed by separating the non-silicide area 2 to become a diffused resistor portion on the substrate 1 and silicide areas 3 on both the ends of the non-silicide area 2, thereby preventing the silicide-formation reaction of the non-silicide area 2 to be expected as a diffused resistor portion on the substrate 1.

Herein, the method of separating and forming the non-silicide area 2 and silicide area 3 will be described. First of all, after depositing the protective oxide 6 all over the surface of the non-silicide area 2 except a wiring-connecting portion 2a (Refer to FIG. 9) on both the end portions thereof, a cobalt layer 7 is deposited all over the surface of the protective oxide 6 which spans the surfaces of the wiring-connecting portion 2a and the isolation dielectric 5, followed by annealing as they are. During annealing, Co chemically reacts with Si, to thereby form the silicide area 3 on the wiring-connecting portion 2a. On the other hand, unreacted Co remains on the surfaces of the protective oxide 6 and the isolation dielectric 5. Then, selectively removing the unreacted Co by use of an acid-mixture ($H_3PO_4/CH_3COOH/HNO_3$) and hydrogen peroxide ($H_2O_2$) produces the silicide area ($CoSi_2$) 3 only within the wiring-connecting portions 2a.

Referring to FIG. 8, a residual Co 7a (residual refractory metal) remains after removing the unreacted Co, and is observed by means of measurement by the total reflection fluorescent X-ray and the like, the residual quantity being very small (about 5E12-1E10 atom/$cm^2$). This residual Co 7a diffuses into the inside of the substrate 1 by annealing afterwards. However, that Co is usually trapped within a micro defect layer existing in the boundary between the silicide layer of $CoSiO_2$ and Si, and at a gettering site provided in the inside of the substrate 1.

In addition, referring to FIG. 6, contact holes 9 are provided on the side of both the ends of a contact interlayer dielectric 8, and corresponds to the silicide areas 3; upper aluminum wirings 10 are connected to the silicide areas 3 through the contact holes 9.

Since the conventional semiconductor device is configured as mentioned above, there has been the following drawback therein. That is, in a high-tech process where a microfabrication technique has been advanced, temperature-lowering and time-shortening of S/D annealing have been developed, and there might exist a microdefect caused by ion implantation damages within a normal junction. The microdefect existing within the junction presents no problem in electrical characteristics. However, when the residual Co 7a remaining on the protective oxide 6 and isolation dielectric 5 is trapped in the microdefect, that Co causes a silicide reaction. Thereby, the microdefect not only expands by the volume expansion thereof, but also the expanded microdefect grows up with an accelerating speed by the silicide reaction, when a new residual Co is trapped in the expanded microdefect. Before long, the expanded defect becomes a huge defect portion spanning the junction, and results in junction leakage in electrical characteristics. In other words, there has been a drawback that the residual refractory metal becomes a critical defect for the device. Particularly, the product equipped with a highly accurate A/D and D/A converter uses a lot of diffused resistors. When the semiconductor device requires a layout in which the active zone to be non-silicide is enlarged, there has been a problem that the residual Co easily combines with the microdefect of non-silicide area 2, rendering a factor of reduced yield.

SUMMARY OF THE INVENTION

The present invention has been accomplished to solve the above-mentioned drawbacks, and is directed to a semiconductor device in which a residual refractory metal is easily captured, a junction leakage in a diffused layer within a non-silicide area can be reduced by preventing trappings of residual high-melting metals into the non-silicide area, rendering an improved yield thereof.

Moreover, the present invention is directed to a semiconductor device in which the capture of the residual refractory metal is accelerated, and thereby the production of the critical defect within the non-silicide area can be suppressed.

According to a first aspect of the present invention, there is provided a semiconductor device comprising: a non-silicide area deposited on a substrate to form a resistive element; a protective oxide deposited over the non-silicide area except a portion of the non-silicide area; and a silicide area formed on the portion of the non-silicide area by depositing a refractory metal all over the surface of the protective oxide, followed by annealing treatment, wherein a dummy silicide area is provided in the vicinity of the non-silicide area.

Here, the dummy silicide area may be disposed in the inside of a diffused resistor of the non-silicide area.

When the non-silicide area is provided with a plurality of diffused resistors, the plurality of diffused resistors being connected in series, a silicide area may be formed within the connecting portion thereof.

In addition, the silicide area may be formed within 200 microns or less with respect to the diffused resistive layer of the non-silicide area.

Further, the non-silicide area may be configured so that the length per unit of the diffused resistive layer the non-silicide area is 200 microns or less

DETAILED DESCRIPTION OF THE PREFERRED EMBODIMENTS

An embodiment of the present invention will be described below.

Embodiment 1

Figure 1:
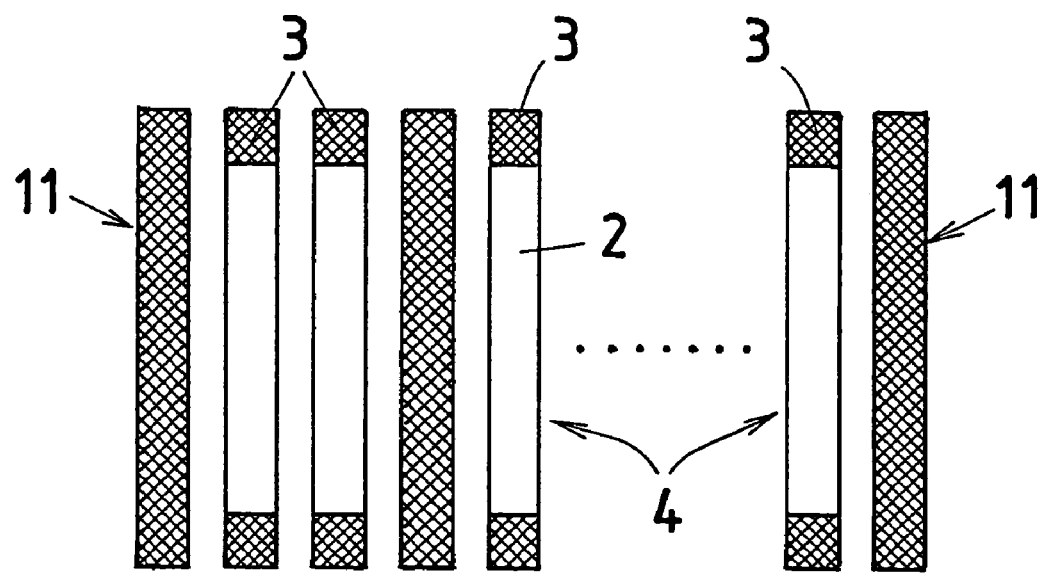
FIG. 1 is a plan view showing a separated state of the diffused resistor of the semiconductor device according to Embodiment 1 of the present invention.

FIG. 1 is a plan view showing a separated state of a diffused resistor of a semiconductor device according to Embodiment 1 of the present invention, and it will be explained by designating the same or corresponding portions therein as those of FIGS. 6-9 by similar numerals.

Figure 6:
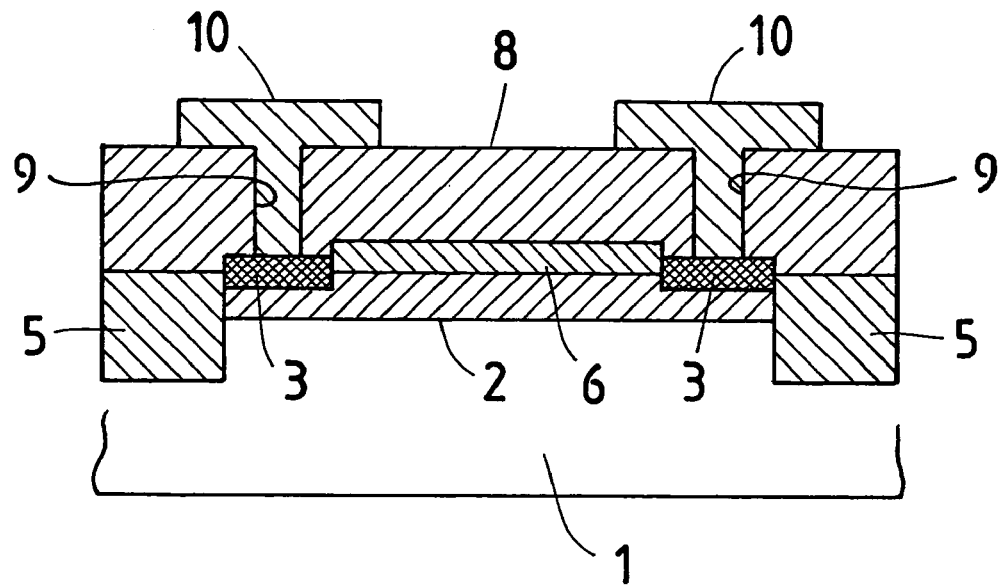
FIG. 6 is a sectional view taken in a direction of longitudinally of a resistor in a conventional semiconductor device.
Figure 7:
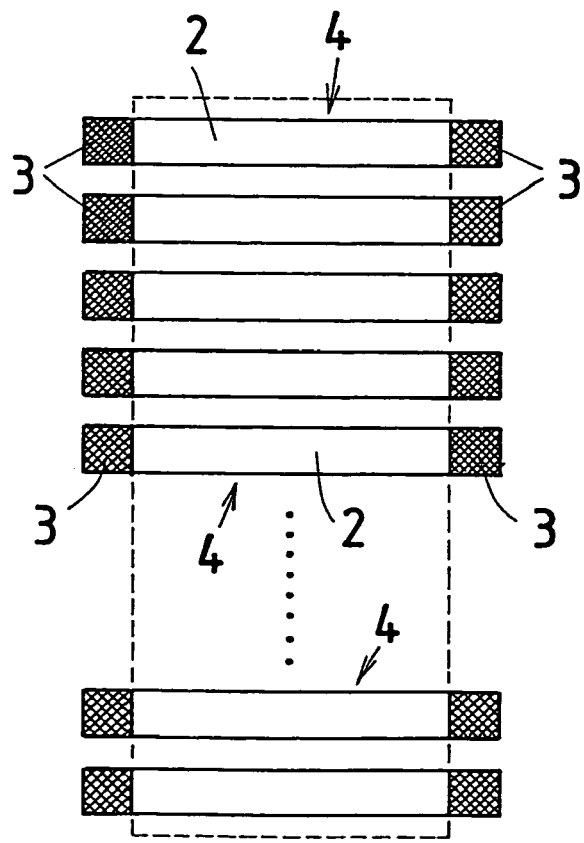
FIG. 7 is a plan view showing the separated state of the diffused resistor shown in FIG. 6.
Figure 8:
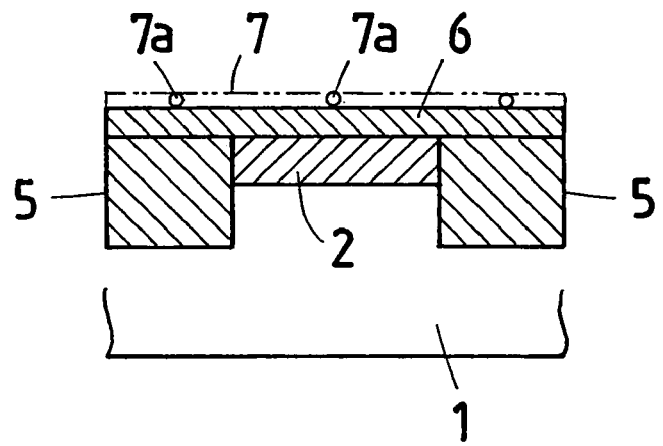
FIG. 8 is a sectional view taken in an orthogonal direction to the direction of longitudinally of the diffused resistor shown in FIG. 6.
Figure 9:
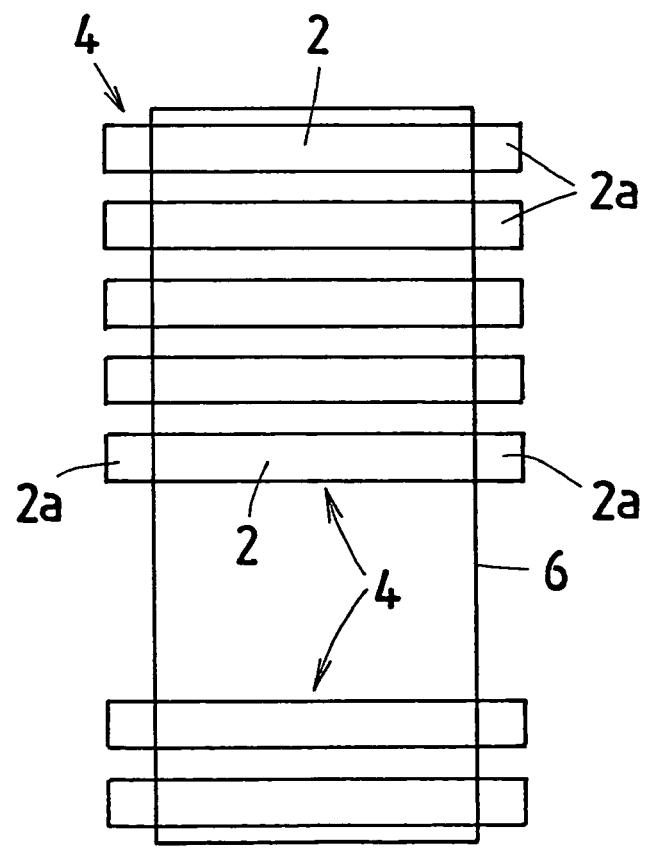
FIG. 9 is a plan view of the diffusion resistor shown in FIG. 8.

Referring to FIG. 1, a non-silicide area 2 is deposited on a substrate 1 shown in FIG. 6 and FIG. 8. Silicide areas 3 are deposited on both the ends of the non-silicide area 2 to form a resistor 4.

A dummy silicide area 11 is made silicide all over the area as a dummy active zone, and is arranged in the vicinity of the non-silicide area 2. In Embodiment 1, the dummy silicide area 11 is arranged in parallel alternately with a plurality of resistors 4 provided by forming the silicide area 3 on both the ends of the non-silicide area 2 as mentioned above, and are configured in the state of interposing a plurality of the resistors 4 therebetween. By the way, since the other composition of the semiconductor device according to Embodiment 1 is the same as those of FIGS. 6 and 8, the explanation will be omitted.

As mentioned above, since the dummy silicide area 11 as an active area is arranged in the vicinity of the non-silicide area 2 having the silicide area 3 on both the ends of the non-silicide area 2, the residual refractory metal (Co) 7a produced as shown in FIG. 8 is captured in the dummy silicide area 11, and the trapping of the residual refractory metal 7a into the non-silicide area 2 can be prevented. For this reason, a junction leakage within the non-silicide area 2 can be reduced, thereby improving the yield.

Embodiment 2

Figure 2:
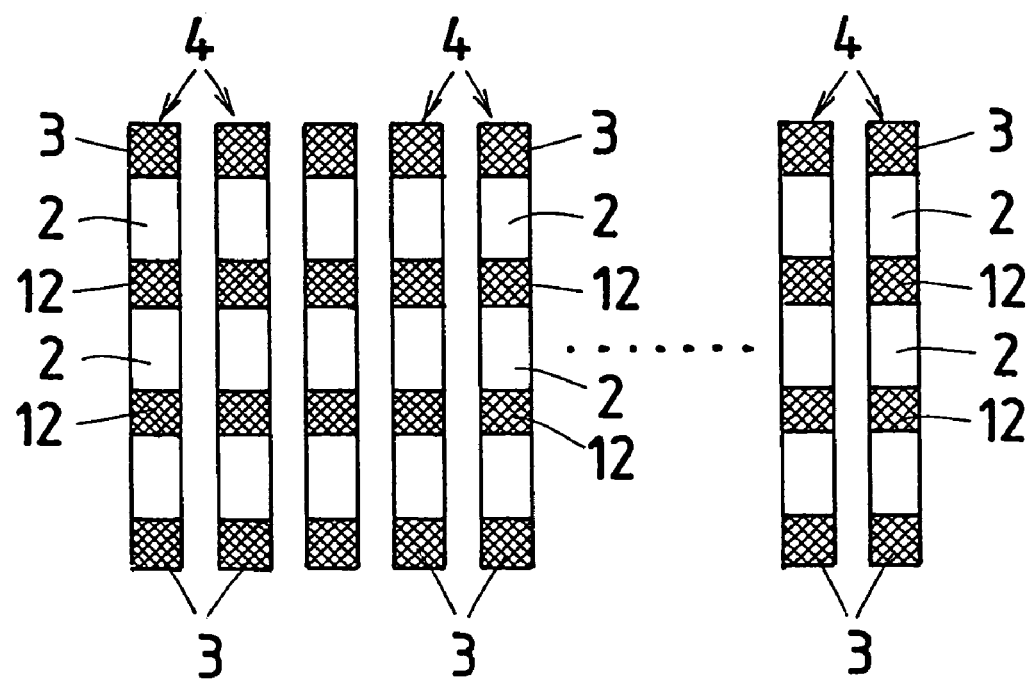
FIG. 2 is a plan view showing a separated state of the diffused resistor of the semiconductor device according to Embodiment 2 of the present invention.

FIG. 2 is a plan view showing a separated state of a diffused resistor of a semiconductor device according to Embodiment 2 of the present invention, and it will be explained by designating the same portions therein as those of FIG. 1 and FIGS. 6-9 by similar numerals.

Referring to FIG. 2, dummy silicide areas 12 are arranged in the inside of the diffused resistor portion of a non-silicide area 2. That is, in the above-mentioned Embodiment 1, the composition in which the dummy silicide area 11 other than the resistor 4 is formed and arranged in the vicinity of the resistor 4. In Embodiment 2, however, the dummy silicide area 12 is formed within the inside of the diffused resistor of the non-silicide area 2 having a silicide area 3 for the wiring-connecting terminals on both the ends thereof. The composition, the dummy silicide area 12 is arranged at a regular interval from the silicide area 3 on both the ends of the non-silicide area 2.

As mentioned above, according to Embodiment 2, since the dummy silicide area 12 is provided in the inside of the diffused resistor of the non-silicide area 2 within the resistor 4, the dummy silicide area 12 need not be considered when the plurality of resistors 4 are uniformly located in a parallel arrangement. Additionally, since the resistors 4 each have the dummy silicide area 12 within the diffused resistor portion of the non-silicide area 2, the residual refractory metal 7a can be efficiently captured in the dummy silicide area 12 of each resistor 4 when the residual refractory metal 7a is produced on the protective oxide 6 (refer to FIG. 8) over the surface of the non-silicide area 2. As a result, a junction leakage in the non-silicide area 2 can be reduced, thereby eliminating the occurrence of the critical defect in the device caused by the junction leakage.

Embodiment 3

Figure 3:
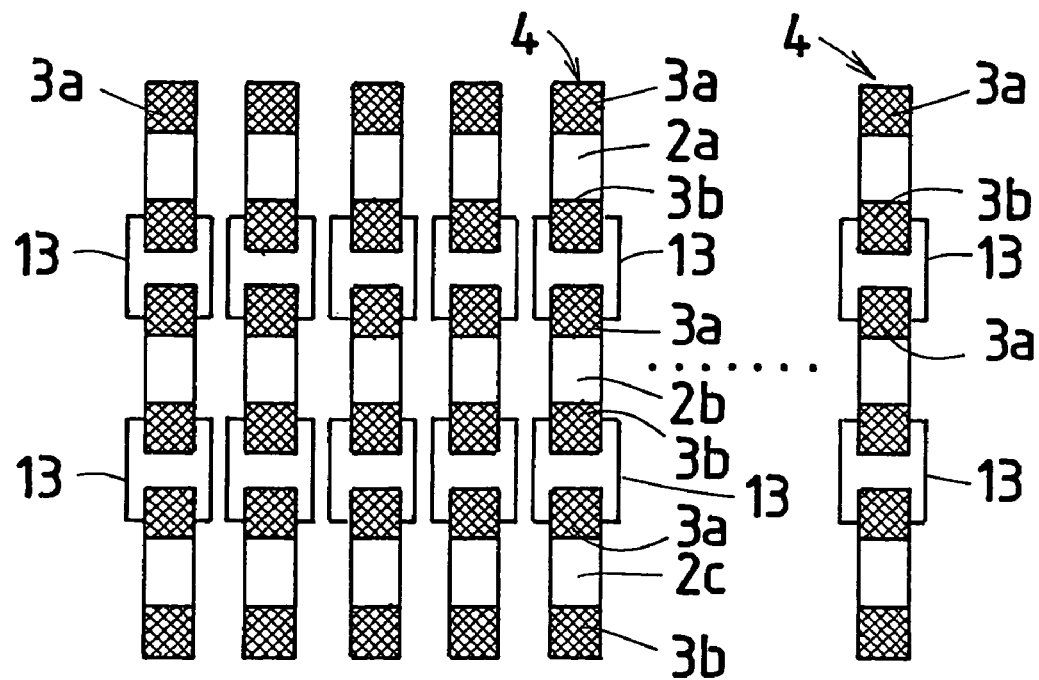
FIG. 3 is a plan view showing a separated state of the diffused resistor of the semiconductor device according to Embodiment 3 of the present invention.

FIG. 3 is a plan view showing a separated state of a diffused resistor of a semiconductor device according to Embodiment 3 of the present invention. Referring to the figure, divided non-silicide areas 2a, 2b, and 2c are formed by dividing each resistor 4 into a plurality of active areas to be connected in series, and each of the divided silicide areas 2a, 2b, and 2c has silicide areas 3a and 3b formed on both the ends thereof. An aluminum wiring 13 (upper wiring) connects in series adjacent-in-series silicide areas 3a and 3b of the divided non-silicide areas 2a, 2b and 2c in each resistor 4

That is, in Embodiment 3, each resistor 4 is divided into a plurality of the divided non-silicide areas 2a, 2b, and 2c; the silicide areas 3a and 3b are formed on both the ends of each of the divided non-silicide areas 2a, 2b, and 2c; the silicide areas 3a and 3b mutually opposed between the adjacent-in-series divided non-silicide area 2a, 2b, and 2c are connected in series by the aluminum wirings 13; and thereby either of the silicide areas 3a and 3b in the divided non-silicide areas 2a, 2b, and 2c is made to function as a dummy silicide area for capturing the residual refractory metals.

As mentioned above, according to Embodiment 3, since the divided non-silicide areas 2a, 2b, and 2c of each resistor 4 has a shortened distance between the silicide areas 3a and 3b provided on both the ends of each non-silicide area, the residual refractory metal 7a can be efficiently captured in either of the silicide areas 3a and 3b existing in the vicinity when residual refractory metal 7a is produced on the protective oxide 6 over the surface of the divided non-silicide areas 2a, 2b, and 2c. As a result, a junction leakage in the non-silicide area 2 can be reduced, thereby eliminating the occurrence of the critical defects in the device caused by the junction leakage.

Embodiment 4

Figure 4:
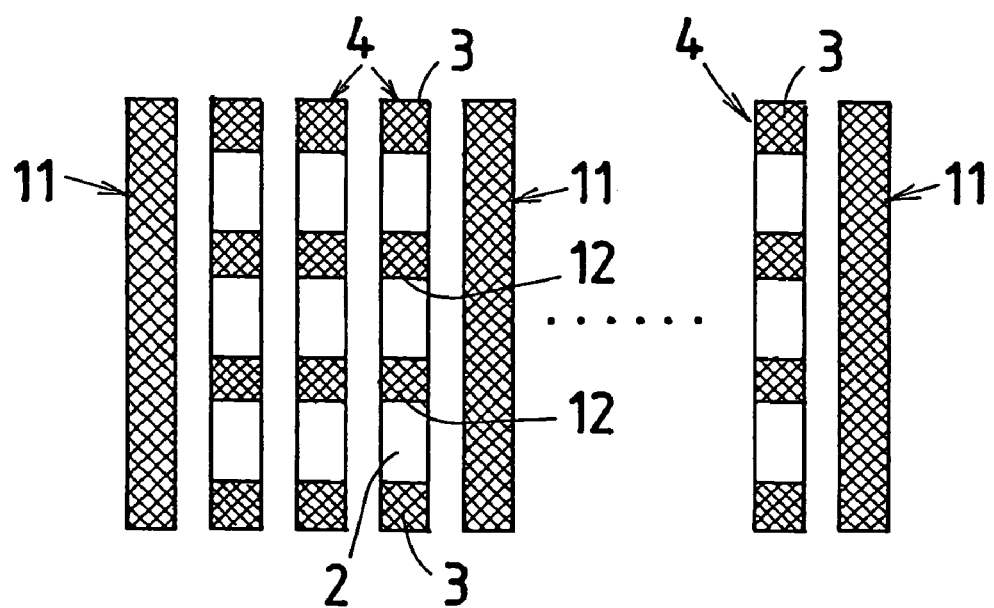
FIG. 4 is a plan view showing a separated state of the diffused resistor of the semiconductor device according to Embodiment 4 of the present invention.

FIG. 4 is a plan view showing a separated state of a diffused resistor of a semiconductor device according to Embodiment 4 of the present invention.

In Embodiment 4, a combined composition of the resistor 4 according to Embodiment 2 and the dummy silicide area 11 according to Embodiment 1 is employed.

That is, a plurality of resistors 4 and dummy silicide areas 11 other than the resistors 4 are alternatively provided in a parallel arrangement, when the resistor 4 have a composition in which a dummy silicide area 12 is arranged at an interval from a silicide area 3 within the inside of the diffused resistor of a non-silicide area 2 having the silicide areas 3 on both the ends thereof.

According to Embodiment 4 using such a composition, since the capturing area of the residual refractory metal is increased by the dummy silicide area 11 in the vicinity of the resistor 4 and dummy silicide area 12 existing within the inside of diffused resistor in the non-silicide area 2, the residual refractory metal can be more efficiently captured. As a result, a junction leakage in non-silicide area 2 can be effectively reduced, thereby eliminating the occurrence of the critical defect in the device caused by the junction leakage.

Embodiment 5

Figure 5:
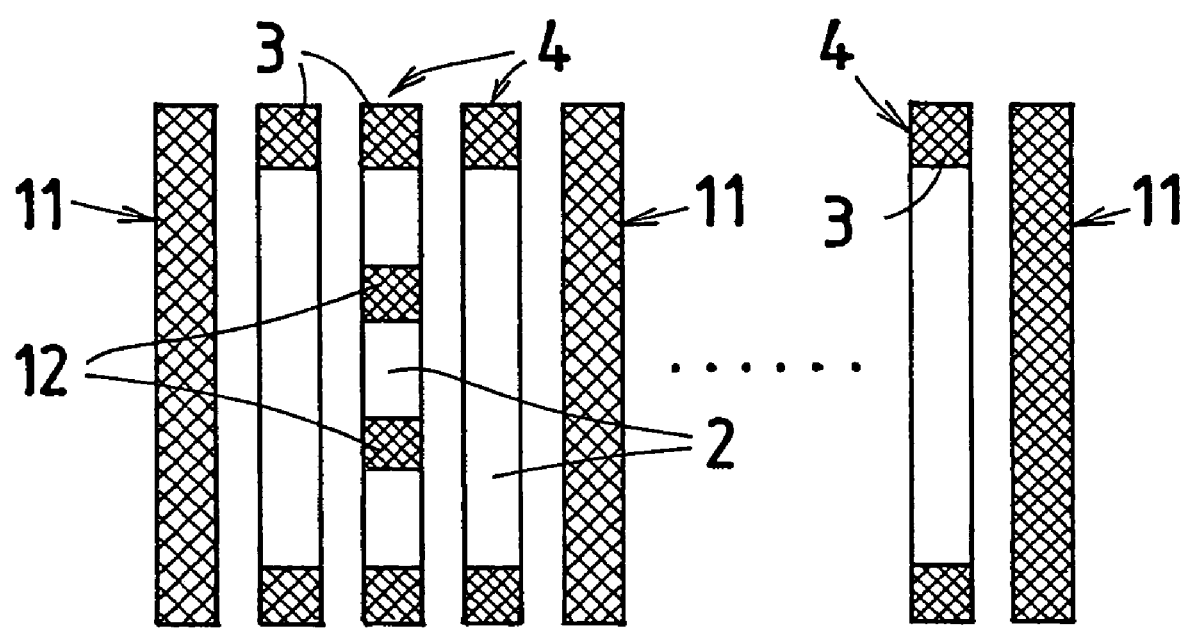
FIG. 5 is a plan view showing a separated state of the diffused resistor of the semiconductor device according to Embodiment 5 of the present invention.

FIG. 5 is a plan view showing a separated state of a diffused resistor of a semiconductor device according to Embodiment 5 of the present invention.

In Embodiment 5, a combined composition of the resistor 4 and dummy silicide area 11 according to Embodiment 1 and the resistor 4 according to Embodiment 2 is employed.

That is, in the composition, one resistor 4 formed by forming a silicide area 3 on both the ends of a non-silicide area 2, and the other resistor 4, having a composition in which a dummy silicide area 12 is arranged at an interval from the silicide area 3 within the inside of the diffused resistor of the non-silicide area 2 having silicide areas 3 on both the ends thereof, are alternatively provided in a parallel arrangement, and additionally, on both the sides of the arrangement, the dummy silicide areas 11 separated from the each resistor 4 are provided.

Also according to Embodiment 5 with such a composition, the capture of the residual refractory metal can be accelerated by the dummy silicide area 12 within the inside of the diffused resistor of the non-silicide area 12 and dummy silicide area 11 in the vicinity of the resistor 4. As a result, a junction leakage in the non-silicide area 2 can be effectively reduced, thereby eliminating the occurrence of the critical defects in the device.

Embodiment 6

In Embodiment 6, the silicide area 3, that was formed on both the ends of the non-silicide area 2 in Embodiment 1, is formed within 200 microns or less with respect to the diffused resistor portion of the non-silicide area 2. As a result, the capture of the residual refractory metal will be accelerated.

Embodiment 7

In Embodiment 7, the interval (the length of the diffused resistive layer) placed between the silicide area 3 formed on both the ends of the non-silicide area 2 and dummy silicide area 12 formed within the inside of the diffused resistor portion of the non-silicide area 2 in Embodiment 2 is configured to be 200 microns or less. In addition, the length of each diffused resistive layer of the divided non-silicide areas 2a, 2b, and 2c of each resistor 4 in Embodiment 3 is also configured to be 200 microns or less in Embodiment 7.

The effect that the composition in which, as mentioned above, the length of the diffused resistive layer of the non-silicide area 2 of the resistor 4 according to Embodiment 2 is configured to be 200 microns or less, and additionally, and the length of the diffused resistive layer of each of the divided non-silicide areas 2a, 2b, and 2c of the resistor 4 according to Embodiment 3 is configured to be 200 microns or less, thereby accelerating the capture of the residual refractory metal.

By the way, in the aforementioned embodiments, the silicide areas 3, 3a, 3b, and dummy silicide areas 11 and 12 are formed by use of either of $CoSi_2$, $TiSi_2$, $NiSi_2$ and $WSi_2$.

As mentioned above, according to the present invention, because a dummy silicide area is configured to be arranged in the vicinity of a non-silicide area in a semiconductor device, residual refractory metals produced on the protective oxide over the surface of the non-silicide area can be captured in the above-described dummy silicide area. As a result, the effect that the trapping of the residual refractory metals into the non-silicide area can be prevented, thereby reducing a junction leakage within the non-silicide area. Therefore, the occurrence of the critical defect in the device caused by the junction leakage can be eliminated, resulting in an improved yield.

According to the present invention, because a dummy silicide area is configured to be arranged within the inside of the diffused resistor of a non-silicide area, the dummy silicide area need not be considered when a plurality of resistors are uniformly located in a parallel arrangement; additionally, the residual refractory metals can be efficiently captured in the dummy silicide area within the diffused resistor of the non-silicide area, thereby preventing the trapping of the residual refractory metal into the non-silicide area. As a result, a junction leakage in the non-silicide area can be reduced, eliminating the occurrence of the critical defect in the device caused by the junction leakage, resulting in an improved yield.

According to the present invention, a non-silicide area is divided into a plurality of diffused resistor portions, a plurality of silicide areas are provided in each the divided non-silicide area, and each the divided non-silicide area is configured to be connected in series. Therefore, when residual refractory metals are produced, the silicide existing in the vicinity of the site can be made to function as the dummy silicide area therefor, and thereby the trapping of the residual refractory metals into the non-silicide area can be prevented. As a result, a junction leakage in the non-silicide area can be reduced, thereby eliminating the occurrence of the critical defect in the device caused by the junction leakage, resulting in an improved yield.

According to the present invention, because a silicide area is configured to be provided within 200 microns or less with respect to the diffused resistive layer of the non-silicide area, the capturing the residual refractory metals can be accelerated.

According to the present invention, because the length of the diffused resistive layer within the non-silicide area is configured to be 200 microns or less, the capturing the residual refractory metals can be accelerated.

What is claimed is:

1. A semiconductor device, comprising:
   a semiconductor substrate;
   a first, a second and a third diffusion resistors formed in said semiconductor substrate and arranged in parallel to each other, and each diffusion resistor having a top surface, a first end and a second end opposing said first end;
   an isolation dielectric film surrounding each of said first, second and third diffusion resistors in plan view;
   a first silicide film formed on said top surface of said first and third diffusion resistors; and
   a second silicide film formed on said top surface of said second diffusion resistor,
   wherein said second diffusion resistor is arranged between said first and third diffusion resistors, and
   wherein said first silicide film covers a whole top surface of said first and third diffusion resistors, and said second silicide film partially covers the top surface of said second diffusion resistor at said first and second ends and a portion between said first and second ends of said second diffusion resistor is not covered with said second silicide film, and wherein the first silicide and the second silicide are CoSi.

2. The semiconductor device according to claim 1, wherein said second diffusion resistor includes a pair of diffusion resistors arranged in parallel between said first and third diffusion resistors.

3. The semiconductor device according to claim 2, further comprising a fourth diffusion resistor formed in said semiconductor substrate and arranged in parallel to said first, second, and third diffusion resistors, said fourth diffusion resistor having a top surface, a first end and a second end opposing said first end, a third silicide film partially covers the top surface of the fourth resistor at said first and second ends and at regular intervals therebetween, said fourth diffusion resistor positioned between the pair of diffusion resistors.

4. The semiconductor device according to claim 3, wherein the silicide formed is formed within 200 microns or less with respect to the portion which is not covered.

5. The semiconductor device according to claim 2, wherein the silicide form is formed within 200 microns or less with respect to said portion which is not covered.

6. The semiconductor device according to claim 1, wherein the silicide film is formed within 200 microns or less with respect to the portion not covered.

7. A semiconductor device comprising:
   a semiconductor substrate;
   a plurality of diffusion resistors formed in said semiconductor substrate and arranged in parallel to each other, and each diffusion resistor having a top surface, a first end and a second end opposing said first end;
   an isolation dielectric film surrounding each diffusion resistor in plan view; and
   a plurality of silicide films partially cover the top surface of each diffusion resistor at said first and second ends and at regular intervals between the first and second ends, wherein the silicide is CoSi.

8. The semiconductor device according to claim 7, further comprising
   at least two additional diffusion resistors formed in said semiconductor substrate and arranged in parallel to said plurality of diffusion resistors, each additional diffusion resistor having a top surface, and an additional silicide film formed on a whole top surface of said each additional diffusion resistor, and
   at least some of said plurality of diffusion resistors arranged between said at least two additional diffusion resistors.

9. The semiconductor device according to claim 8, wherein a length of each non-silicide area of each diffusion resistor between the regular intervals is 200 microns or less.

10. The semiconductor device according to claim 7, wherein a length of each non-silicide area between the regular intervals is 200 microns or less.

11. A semiconductor device comprising:
    a semiconductor substrate;
    a plurality of diffusion resistors formed in said semiconductor substrate and arranged in parallel to each other,
    an isolation dielectric film surrounding each diffusion resistor in plan view;
    each diffusion resistor formed by a plurality of separate areas to be connected in series; and
    a silicide film partially covers a top surface of each separate area at first and second ends of each separate area and a portion between said first and second ends of each separate area is not covered by the silicide film, wherein the silicide is CoSi.

* * * * *